United States Patent
Skaug

(10) Patent No.: US 12,107,545 B1
(45) Date of Patent: Oct. 1, 2024

(54) PROVIDING TEMPERATURE COMPENSATION TO AN RC OSCILLATOR

(71) Applicant: Silicon Laboratories Inc., Austin, TX (US)

(72) Inventor: Steffen Skaug, Oslo (NO)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/308,083

(22) Filed: Apr. 27, 2023

(51) Int. Cl.
| | |
|---|---|
| *H03B 5/24* | (2006.01) |
| *H03B 5/04* | (2006.01) |
| *H03K 3/011* | (2006.01) |
| *H03K 3/03* | (2006.01) |
| *H03K 4/501* | (2006.01) |
| *H03L 1/02* | (2006.01) |

(52) U.S. Cl.
CPC ............... *H03B 5/24* (2013.01); *H03B 5/04* (2013.01); *H03K 3/011* (2013.01); *H03K 3/03* (2013.01); *H03K 4/501* (2013.01); *H03L 1/026* (2013.01)

(58) Field of Classification Search
CPC ...... H03K 3/0231; H03K 3/03; H03K 3/0315; H03K 3/354; H03K 4/50; H03K 4/501; H03K 4/502; H03K 3/011; H03B 5/24; H03L 1/02; H03L 1/022; H03L 1/026
See application file for complete search history.

(56) References Cited

U.S. PATENT DOCUMENTS

| | | | |
|---|---|---|---|
| 9,300,247 B2 | 3/2016 | Roine et al. | |
| 9,342,084 B1 | 5/2016 | Konecny et al. | |
| 10,175,707 B1 | 1/2019 | Wei et al. | |
| 2008/0265854 A1 | 10/2008 | Lee | |
| 2013/0176082 A1* | 7/2013 | Ishikawa | G05F 3/30 |
| | | | 331/36 C |
| 2015/0015222 A1 | 1/2015 | Ivanov | |
| 2015/0116042 A1* | 4/2015 | Kim | H03K 3/011 |
| | | | 331/57 |
| 2015/0220096 A1 | 8/2015 | Luff | |
| 2015/0355653 A1 | 12/2015 | Drebinger | |
| 2016/0147239 A1 | 5/2016 | Yan | |
| 2017/0093399 A1 | 3/2017 | Atkinson et al. | |

FOREIGN PATENT DOCUMENTS

| | | | | |
|---|---|---|---|---|
| CN | 104682871 A | * | 6/2015 | ............. H03K 3/011 |
| EP | 1018804 A1 | * | 7/2000 | ............. H03K 3/011 |

* cited by examiner

*Primary Examiner* — Ryan Johnson
(74) *Attorney, Agent, or Firm* — Trop, Pruner & Hu, P.C.

(57) ABSTRACT

In one aspect, an apparatus includes an oscillator to generate a clock signal, where the oscillator includes: at least one resistor; at least one capacitor; and a circuit coupled to the at least one resistor and the at least one capacitor, the circuit to generate the clock signal. The apparatus further includes a voltage regulator coupled to the oscillator to provide a regulated voltage to the oscillator, and a bulk voltage generator coupled to the voltage regulator. The bulk voltage generator may provide first and second bulk voltages to the voltage regulator to provide temperature compensation to the oscillator.

20 Claims, 6 Drawing Sheets

PROVIDING TEMPERATURE COMPENSATION TO AN RC OSCILLATOR

BACKGROUND

Many integrated circuits (ICs) include mixes of analog and digital circuitry. Often times, an IC includes multiple on-chip oscillators to generate clock signals for use by various circuitry of the chip. One type of oscillator is an RC oscillator, which is typically implemented with one or more resistors and capacitors and other circuitry. While such RC circuits provide many benefits, there are challenges owing to inaccuracy of included resistors and capacitors, particularly over large temperature ranges at which an IC may operate.

Certain semiconductor processes provide multiple flavors of resistors that have different temperature coefficients. When a given process has resistors with temperature coefficients of both polarities, a combination of these different resistor types can be used to compensate each other. However, other semiconductor processes have only a single polarity of resistor such that the above-described compensation is not available.

SUMMARY OF THE INVENTION

In one aspect, an apparatus includes an oscillator to generate a clock signal, the oscillator comprising: at least one resistor; at least one capacitor; and a circuit coupled to the at least one resistor and the at least one capacitor, the circuit to generate the clock signal. The apparatus further includes a voltage regulator coupled to the oscillator to provide a regulated voltage to the oscillator, and a bulk voltage generator coupled to the voltage regulator. The bulk voltage generator may provide a first bulk voltage and a second bulk voltage to the voltage regulator to provide temperature compensation to the oscillator.

In an implementation, the voltage regulator comprises: a current mirror having at least one first node coupled to a supply voltage and an output to output a proportional-to-absolute current (PTAT) current; a pass device coupled to the current mirror to receive the PTAT current and output the regulated voltage; and a diode circuit comprising a first diode-connected transistor and a second diode-connected transistor, wherein the first diode-connected transistor is to receive the first bulk voltage and the second diode-connected transistor is to receive the second bulk voltage.

The first diode-connected transistor may include: a first terminal coupled to the pass device; a second terminal coupled to a third terminal of the first diode-connected transistor; and a fourth terminal to receive the first bulk voltage. The apparatus may further include: a first transistor coupled to the current mirror and the diode circuit, the first transistor to receive the second bulk voltage; and a second transistor coupled to the current mirror and the diode circuit, the second transistor to receive the second bulk voltage.

In an implementation, the oscillator is to output the clock signal that is temperature compensated based at least in part on the first bulk voltage and the second bulk voltage. The oscillator may include: the circuit comprising at least one inverter; the at least one resistor comprising a programmable resistor coupled to the at least one inverter; and the at least one capacitor comprising a programmable capacitor coupled to the at least one inverter. In an embodiment, the first bulk voltage is a first portion of the regulated voltage and the second bulk voltage is a second portion of the regulated voltage.

In an implementation, the first bulk voltage is a first fixed percentage of the regulated voltage; and the second bulk voltage is a second fixed percentage of the regulated voltage. A sum of the first fixed percentage and the second fixed percentage may equal the regulated voltage.

In an implementation, the bulk voltage regulator comprises at least one digital-to-analog converter (DAC) to receive a digital value and output the first bulk voltage and the second bulk voltage based thereon. The at least one DAC may include: a first DAC to output the first bulk voltage; and a second DAC to output the second bulk voltage. The apparatus may further include a non-volatile storage to store the digital value, the digital value based on manufacturing testing.

In another aspect, a method comprises: receiving, in an integrated circuit, at least one digital value from a non-volatile storage; generating, in the integrated circuit, a first bulk voltage and a second bulk voltage using the at least one digital value; providing the first bulk voltage to at least one first transistor of a voltage regulator of the integrated circuit; providing the second bulk voltage to at least one second transistor of the voltage regulator; and outputting a regulated voltage from the voltage regulator to an RC oscillator of the integrated circuit, to provide temperature compensation to the RC oscillator.

In an embodiment, the method further comprises powering at least one inverter of the RC oscillator using the regulated voltage. The method may also include generating the first bulk voltage and the second bulk voltage in a digital-to-analog converter of the integrated circuit. The method may further include providing the second bulk voltage to at least two transistors of a constant transconductance circuit of the voltage regulator. The method may also include determining the first bulk voltage and the second bulk voltage based at least in part on manufacturing testing.

In yet another aspect, an apparatus includes an RC oscillator comprising: a first circuit to receive a first signal and generate a clock signal based at least in part on the first signal, the first circuit to receive a regulated voltage from a voltage regulator; at least one resistor coupled to the first circuit, the at least one resistor having temperature variation; and at least one capacitor coupled to the first circuit. The apparatus may further include the voltage regulator coupled to the RC oscillator, and the voltage regulator may include: a transconductance circuit to receive a supply voltage and output a PTAT current; a pass device coupled to the transconductance circuit to receive the PTAT current and output the regulated voltage based on the PTAT current; and a second circuit coupled to the pass device.

The second circuit may include a first transistor and a second transistor, where the first transistor comprises first, second, third and fourth terminals, the second and third terminals coupled together and the fourth terminal to receive a first voltage, and the second transistor comprises first, second, third and fourth terminals, the second and third terminals coupled together and the fourth terminal to receive a second voltage, the first voltage and the second voltage to compensate for a temperature coefficient of the at least one resistor.

The apparatus may also include a non-volatile storage to store at least one digital value to identify the first voltage and the second voltage, and a voltage generator to generate the first voltage and the second voltage based at least in part on the at least one digital value.

In an implementation, the voltage generator comprises a DAC to generate: the first voltage comprising a first bulk voltage that is a first function of temperature; and the second voltage comprising a second bulk voltage that is a second function of temperature. The DAC may generate the first bulk voltage that is a first percentage of the regulated voltage the second bulk voltage that is a second percentage of the regulated voltage.

DETAILED DESCRIPTION

In various embodiments, an RC oscillator is provided with temperature compensation via circuitry that provides bulk voltages that are used to control a temperature coefficient of the RC oscillator. In some embodiments, the bulk voltages are set at predetermined levels to control oscillator drift. More specifically as described herein, this circuitry is implemented in part within a voltage regulator that is provided with bulk voltages, to modify the overall temperature coefficient of the oscillator so that the temperature coefficient of one or more resistors of the RC oscillator is compensated.

Figure 1:
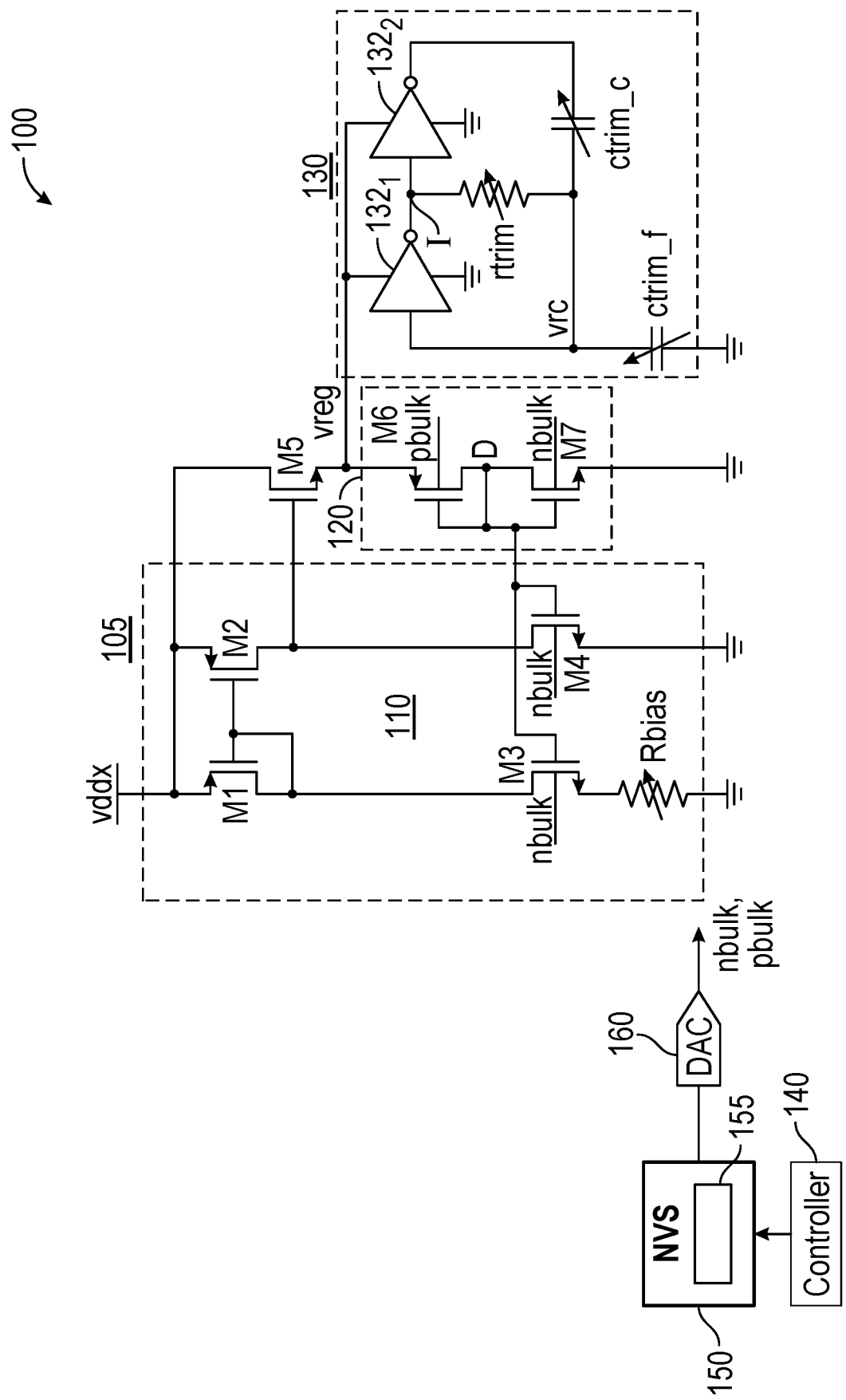
FIG. 1 is a schematic diagram of a portion of an IC in accordance with an embodiment.

Referring now to FIG. 1, shown is a schematic diagram of a portion of an IC in accordance with an embodiment. IC 100, which may be any type of IC such as an Internet of Things (IoT) device, includes a voltage regulator 105 that provides a regulated voltage (vreg) to an RC oscillator 130.

With reference first to voltage regulator 105, a constant transconductance (gm) circuit 110 provides a proportional-to-absolute temperature (PTAT) current to a pass device M5, which outputs the regulated voltage to RC oscillator 130. As further shown, voltage regulator 105 includes a diode circuit 120 formed of a plurality of diode-connected transistors M6, M7. Although the various transistors shown in the implementation of FIG. 1 are metal oxide semiconductor field effect transistors (MOSFETs), understand that in other cases other types of transistors can be used. At a high level, the feedback of constant gm circuit 110 is taken through pass device M5 and diode circuit 120, such that the regulated voltage is equal to the series connection of diode-connected transistors M6, M7, biased by the PTAT current.

Embodiments provide temperature compensation via regulation of bulk voltages that are provided to fourth terminals of diode-connected transistors M6, M7 (and also to additional transistors of transconductance circuit 110).

Transconductance circuit 110 includes a current mirror formed of MOSFETs M1, M2 and additional MOSFETS M3, M4. As seen, MOSFET M1 is a diode-connected MOSFET having commonly coupled gate and drain terminals and a source terminal coupled to a supply voltage node (vddx). The gate terminal of MOSFET M1 is further commonly coupled with the gate terminal of MOSFET M2, which also has a source terminal coupled to the supply voltage node and a drain terminal that provides the PTAT current to the gate terminal of pass device M5.

Transconductance circuit 110 also includes MOSFETs M3, M4. MOSFET M3 has a drain terminal commonly coupled with the drain terminal of MOSFET M1 and a source terminal coupled to a bias resistor Rbias (in turn, coupled to a reference voltage node (e.g., ground)). The gate terminal of MOSFET M3 is commonly coupled with the gate terminal of MOSFET M4 and further couples to an inter-diode terminal D of diode circuit 120. MOSFET M4 is similarly coupled with a source terminal coupled to the reference voltage node, commonly coupled gate terminal with MOSFET M3, and drain terminal coupled to the drain terminal of MOSFET M2 (and the gate terminal of pass device M5).

As shown, pass device M5 has its drain terminal commonly coupled with the source terminals of MOSFETs M1, M2 at the supply voltage node and a source terminal coupled to a regulated voltage node (vreg). While pass device M5 is shown as a NMOS device, in other implementations the pass device may be implemented as a PMOS device.

Still with reference to FIG. 1, diode circuit 120 includes a pair of diode-connected MOSFETs M6, M7. MOSFET M6 has a source terminal coupled to the regulated voltage node and commonly coupled source and gate terminals at inter-diode node D. In turn, MOSFET M7 has a source terminal coupled to the reference voltage node and commonly coupled drain and gate terminals at inter-diode node D.

At least certain MOSFETs shown in FIG. 1 are configured with fourth terminals to receive respective bulk voltages. As will be described further herein, these bulk voltages are set at predetermined values, each of which may be a fixed fraction or percentage of the regulated voltage (and in at least some instances, the sum of these bulk voltages may equal the regulated voltage).

As shown, MOSFET M7 has a fourth terminal to receive the same bulk voltage (nbulk) provided to the fourth terminal of MOSFETs M3, M4, while MOSFET M6 has a fourth terminal to receive a different bulk voltage (pbulk). Note that while the implementation in FIG. 1 is of a complementary metal oxide semiconductor (CMOS) configuration, other implementations may use other semiconductor technologies such as silicon on insulator (SOI), in which case the bulk voltages are implemented as body voltages.

In various embodiments, these bulk voltages can be set to a fixed percentage of the regulated voltage. Furthermore, these bulk voltages can be set to be relatively close to the rails, so that the source/drain-to-bulk diodes do not conduct a significant amount of current. Of course, in other embodiments the bulk voltage can be set to any voltage that is a function of temperature. By providing these predetermined bulk voltages, temperature drift of the resistor(s) of RC oscillator 130 may be compensated.

With reference now to RC oscillator 130, a pair of inverters $132_{1,2}$ are provided in a ring fashion, with a programmable resistor (rtrim) coupled at an inter-inverter node I. As further shown, programmable capacitors (ctrim_c and ctrim_f) are present. These programmable devices provide several options to perform frequency trimming, with the ctrim_f capacitor to trim frequency in fine steps. Inverter 1321 operates as a comparator that only consumes power around a decision point, enabling high performance for low power. Note also that inverters 132 may be biased with a voltage to hold the gm of its transistors constant at the decision point, thus maintaining a constant response time of the comparator over temperature (at least to a first order). In other cases, inverters 132 may be replaced with other circuitry to receive a signal and generate at least one clock signal based thereon. Also it is possible to use fixed resistors and capacitors, in certain cases.

With this arrangement, temperature compensation for temperature variation of resistor rtrim is realized such that it may be implemented using an available resistor configuration of a given process node, e.g., a high resistivity poly resistor that inherently has temperature drift. By providing the controllable bulk voltages, this temperature drift may be readily compensated.

Note that the circuitry in FIG. 1 is self-contained with no need for external bias current or voltage, simplifying design and saving routing area. Low noise for low power operation may be realized by enabling the vrc node (coupled to the input of inverters 132) to have a large swing (e.g., up to 0.5*vreg above vreg and down to 0.5*vreg below ground).

Still referring to FIG. 1, also shown is circuitry to generate these bulk voltages. In the high level shown in FIG. 1, a controller 140 couples to a non-volatile storage 150, which provides a compensation value (namely at least one digital value 155) to a digital-to-analog converter (DAC) 160. As shown, based on this at least one digital value, DAC 160 generates the bulk voltages. Note that controller 140 may be a microcontroller that causes non-volatile storage 155 to provide the compensation value to DAC 160. To this end, controller 140 may execute instructions stored in a non-transitory storage medium to cause generation of appropriate bulk voltages as described herein.

In various implementations, DAC 160 may be implemented as a resistor string DAC or a switched capacitor DAC, as examples. Depending upon implementation there may be multiple DACs, each to generate one of the bulk voltages from a corresponding digital value. In different implementations, non-volatile storage 150 may be implemented as a flash memory, fuse storage or so forth. In some embodiments, the compensation value may be provided as part of firmware of the IC.

Note that the compensation value may be determined based at least in part on manufacturing testing in which a circuit (either simulated or fabricated) is tested with different values for the bulk voltages to ensure that a suitable amount of temperature compensation is provided for the resistor(s) of the RC oscillator.

Figure 2:
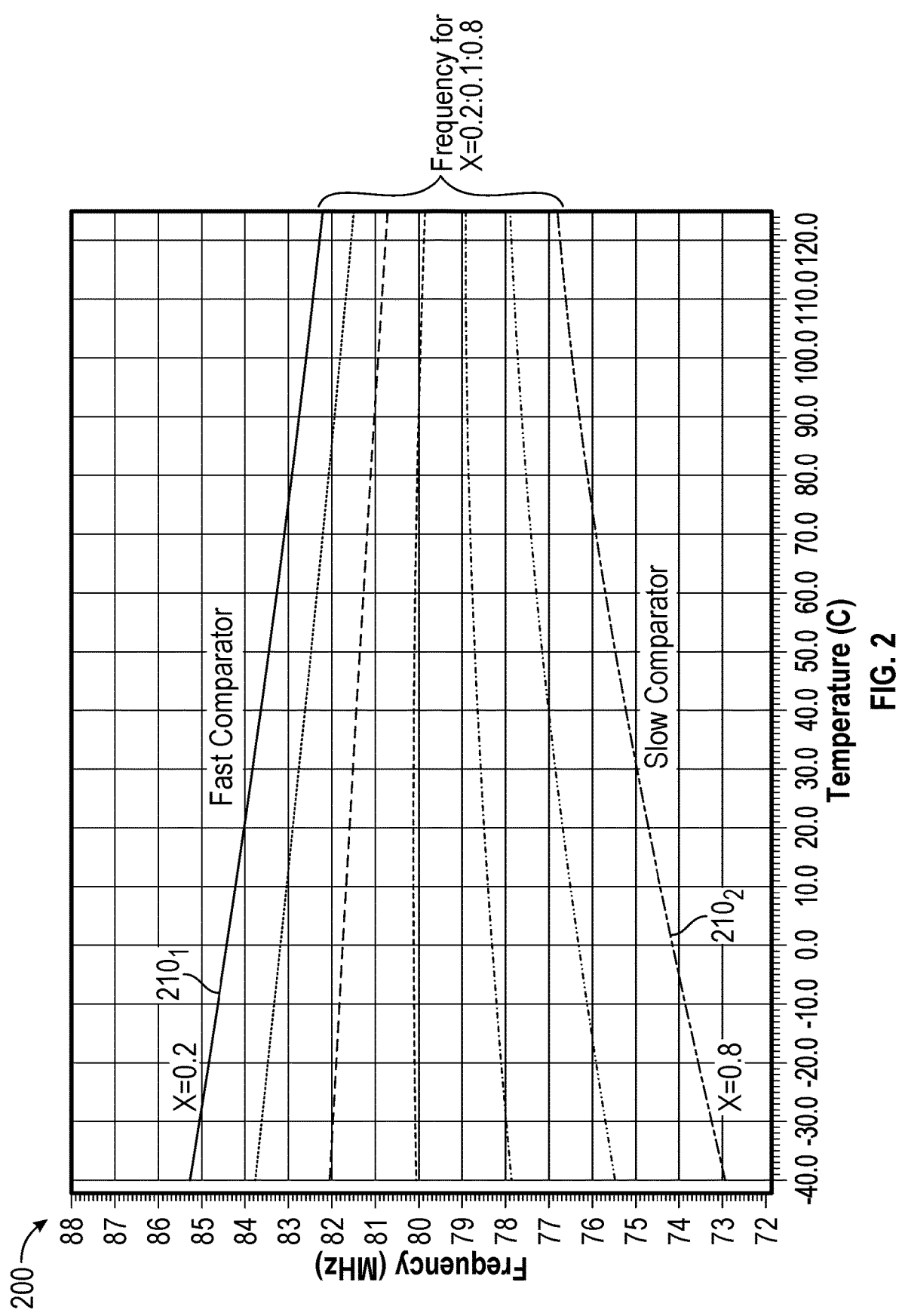
FIG. 2 is a graphical illustration of temperature compensation using different values of bulk voltages in accordance with an embodiment.

Referring now to FIG. 2, shown is a graphical illustration of temperature compensation using different values of bulk voltages in accordance with an embodiment. Illustration 200 presents a number of curves $210_{1-7}$. As shown, each curve 210 provides a frequency vs. temperature comparison for a given setting of a compensation value (as a fraction of regulated voltage for a second bulk voltage (e.g., nbulk)). Note that with this arrangement a first bulk voltage (pbulk) may be equal to a remainder fraction, such that the sum of the first and second bulk voltages equals the regulated voltage. More specifically in this arrangement, nbulk equals x*vreg and pbulk equals (1−x)*vreg. As shown, suitable temperature compensation may be realized with a given value, e.g., x=0.5 desired for a particular implementation. Of course, other suitable bulk voltages that are a function of temperature can be used in other embodiments.

Figure 3:
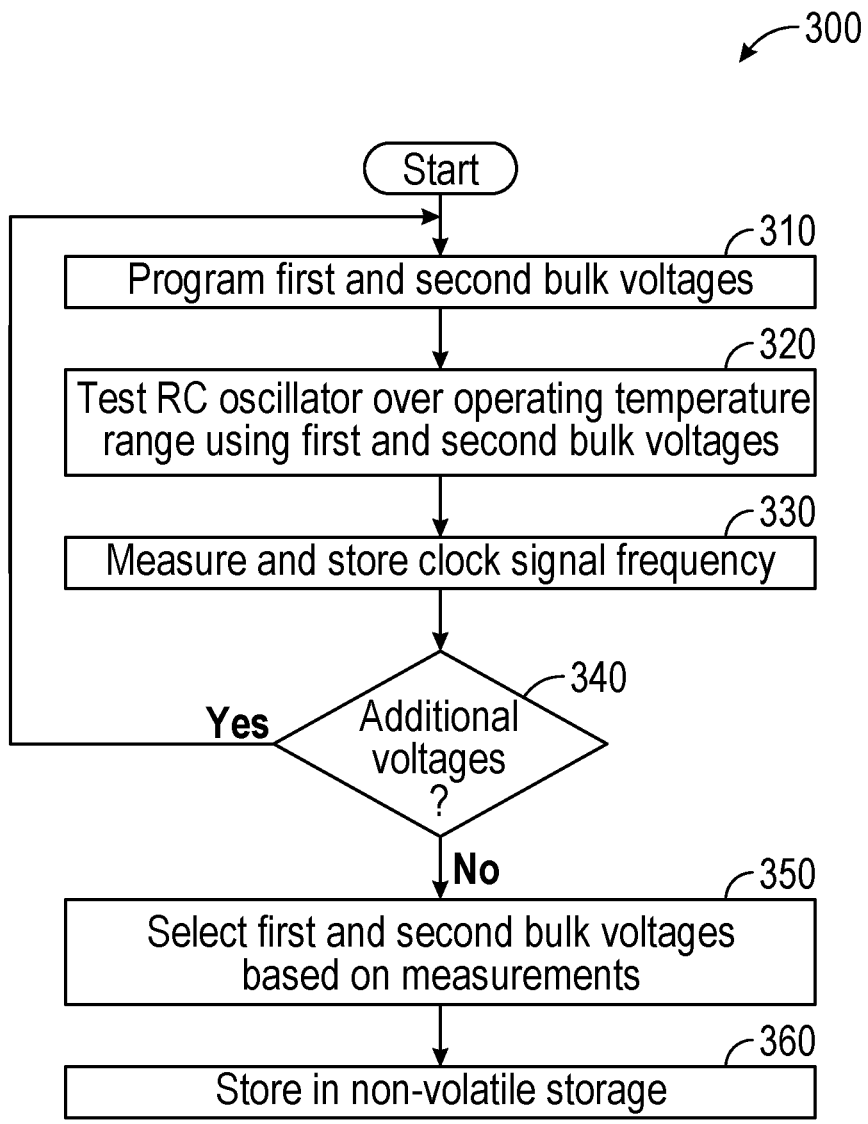
FIG. 3 is a flow diagram of a method in accordance with an embodiment.

Referring now to FIG. 3, shown is a flow diagram of a method in accordance with an embodiment. More specifically as shown in FIG. 3, method 300 is a method for determining appropriate bulk voltages for use in a voltage regulator to provide temperature compensation to an RC oscillator. Method 300 may be performed as part of design and/or manufacturing testing. As such, method 300 may be performed by a designer and/or manufacturer of ICs including an RC oscillator and voltage regulator as described herein.

As shown, method 300 begins by programming first and second bulk voltages into the device (block 310). For example, various simulations can be performed to identify a set of bulk voltages to be tested. The programming may be realized by writing the bulk voltage values into a configuration register or other storage, where it can be accessed and used to generate the bulk voltages on chip.

Still with reference to FIG. 3, next at block 320, the RC oscillator may be tested over an operating temperature range (e.g., a range specified for the IC) using the programmed first and second bulk voltages. At block 330, at various set points of this operating temperature range, a clock signal frequency that is generated by the RC oscillator can be measured and the measured frequency is stored. Then it is determined at diamond 340 whether there are additional voltages to be programmed. If so, control passes back to block 310 for programming of another first and second bulk voltage.

At the conclusion of such testing, control passes to block 350 where first and second bulk voltages can be selected based on the measurements. For example, these first and second bulk voltages may be the voltages that show a most constant clock signal frequency over the entire operating temperature range. Then these bulk voltages can be stored in a non-volatile storage (block 360). For example, these values may be fused into the IC or they can be stored as part of firmware. Understand while shown at this high level in the embodiment of FIG. 3, many variations and alternatives are possible.

Figure 4:
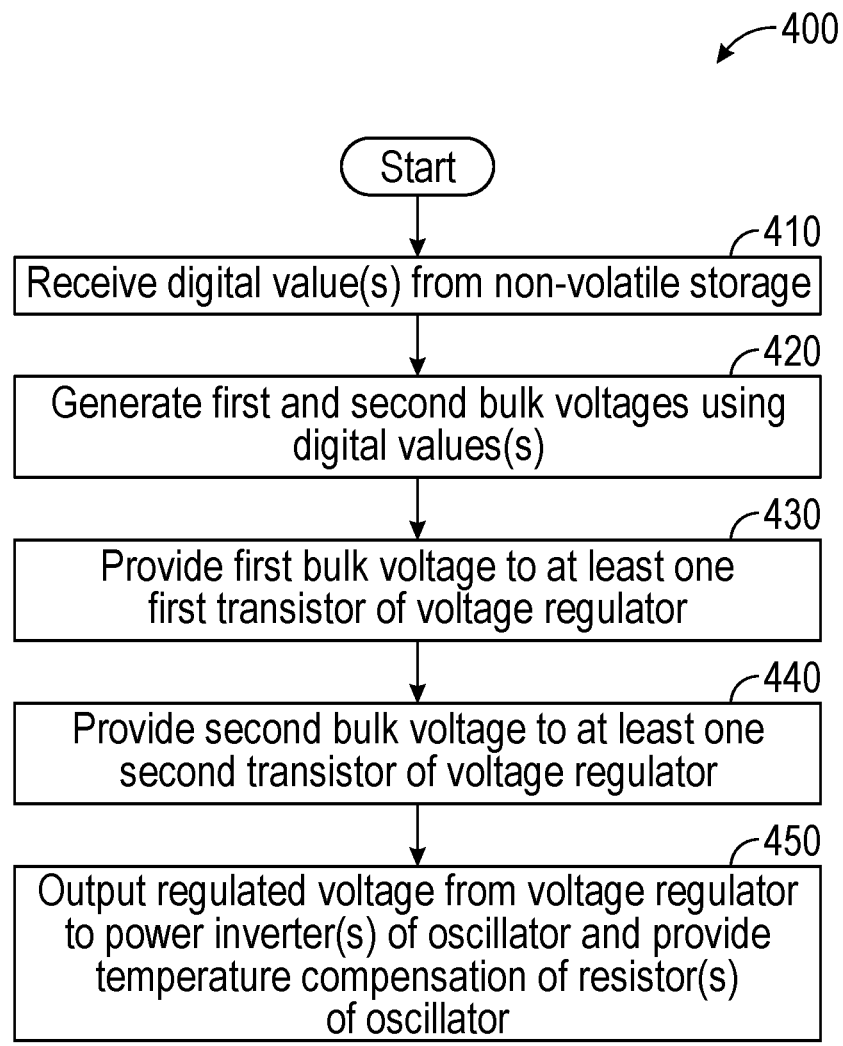
FIG. 4 is a flow diagram of a method in accordance with another embodiment.

Referring now to FIG. 4, shown is a flow diagram of a method in accordance with another embodiment. In FIG. 4, method 400 is a method for operating an IC including an RC oscillator having temperature compensation as described herein. As shown, method 400 begins by receiving one or more digital values from a non-volatile storage (block 410). As described above, this non-volatile storage can be implemented as fuse storage or firmware that is stored in a flash memory. Next at block 420, first and second bulk voltages may be generated using the one or more digital values. For example, one or more DACs may receive the digital values and generate the bulk voltages.

Still with reference to FIG. 4, the first bulk voltage is provided to at least one first transistor of the voltage regulator (block 430). For example, this first bulk voltage may be the pbulk voltage that is provided to the fourth terminal of MOSFET M6 (of FIG. 1). Next at block 440 the second bulk voltage, which may be the nbulk voltage, is provided to at least one second transistor of the voltage regulator (e.g., the fourth terminal of MOSFET M7 (of FIG. 1) and additional transistors of a transconductance circuit of the voltage regulator (e.g., MOSFETs M3, M4 of FIG. 1)). Finally at block 450, the voltage regulator outputs a regulated voltage using these bulk voltages. This regulated voltage may be used to power one or more inverters of the oscillator and provide temperature compensation of resistor(s) of the oscillator.

Thus these bulk voltages may be used to provide temperature compensation to the oscillator. More specifically, by letting the bulk voltages be a voltage other than ground and a suitable function of temperature, vreg vs. temperature can be modified. This modification in turn modifies the speed vs. temperature of an inverter of the oscillator, in turn altering the temperature coefficient of the oscillator in such a way that the resistor temperature coefficient (and any other non-zero temperature coefficients of the circuit) can be compensated. Although shown at this high level in the embodiment of FIG. 4, many variations and alternatives are possible.

Figure 5:
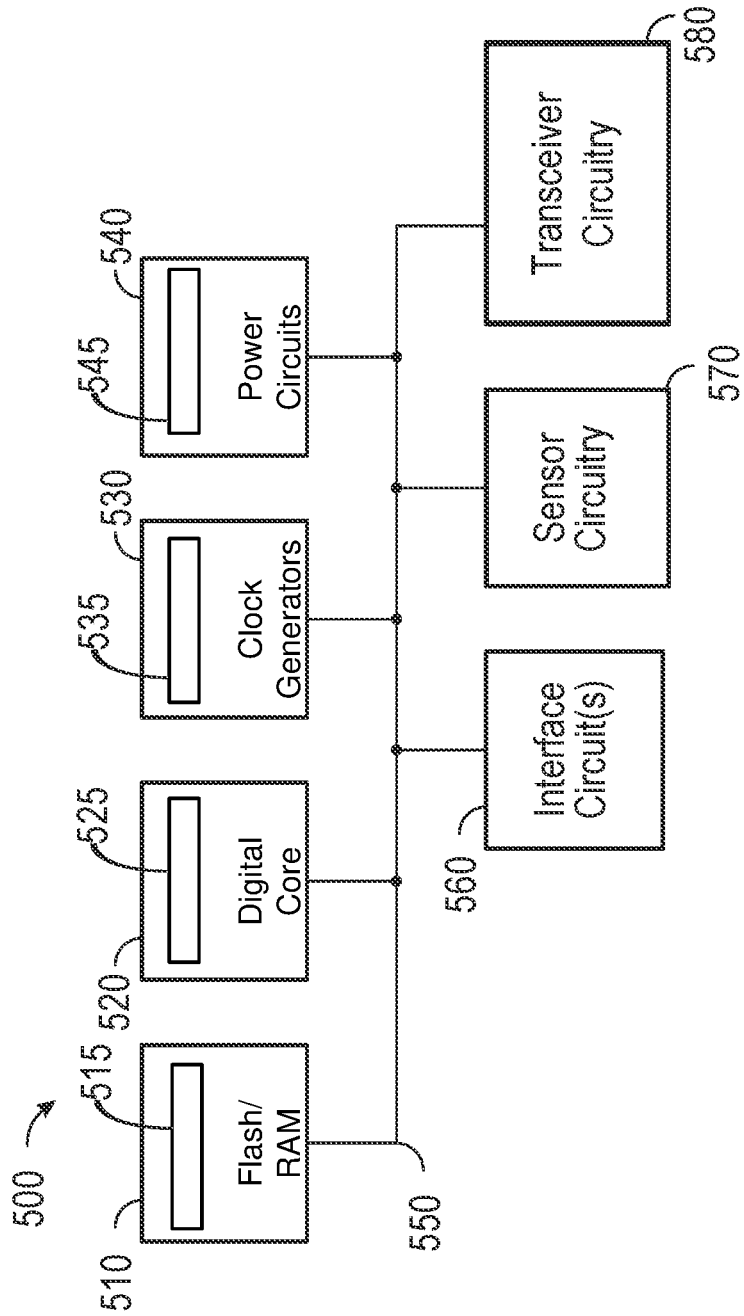
FIG. 5 is a block diagram of a representative integrated circuit that incorporates an embodiment.

Embodiments may be incorporated into many different types of wireless systems. Referring now to FIG. 5, shown is a block diagram of a representative integrated circuit 500 that includes temperature compensation circuitry for an oscillator as described herein. In the embodiment shown in FIG. 5, integrated circuit 500 may be, e.g., a microcontroller, wireless transceiver that may operate according to one or more wireless protocols (e.g., WLAN-OFDM, WLAN-DSSS, Bluetooth, IEEE 802.15.4, among others), or other device that can be used in a variety of use cases, including sensing, metering, monitoring, embedded applications, communications, applications and so forth, and which may be particularly adapted for use in an IoT device.

In the embodiment shown, integrated circuit 500 includes a memory system 510 which in an embodiment may include a non-volatile memory such as a flash memory and volatile storage, such as RAM. In an embodiment, this non-volatile memory may be implemented as a non-transitory storage medium that can store instructions and data. Such non-volatile memory may store in space 515 instructions, including instructions for obtaining and using one or more digital values to generate bulk voltages as described herein as well as the digital values themselves.

Memory system 510 couples via a bus 550 to a digital core 525, which may include one or more cores and/or microcontrollers (including a microcontroller 525) that act as a main processing unit of the integrated circuit. In turn, digital core 520 may couple to clock generators 530 which may include one or more phase locked loops or other clock generator circuitry, such as one or more RC oscillators 535 to generate various clocks for use by circuitry of the IC, and which may be provided with temperature compensation as described herein.

As further illustrated, IC 500 further includes power circuitry 540, which may include one or more voltage regulators 545 having MOSFETs or other transistors to receive non-zero bulk or body voltages to provide the temperature compensation described herein. Additional circuitry may optionally be present depending on particular implementation to provide various functionality and interaction with external devices. Such circuitry may include interface circuitry 560 which may provide interface with various off-chip devices, sensor circuitry 570 which may include various on-chip sensors including digital and analog sensors to sense desired signals, such as for a metering application or so forth. Also shown in FIG. 5, transceiver circuitry 580 may be provided to enable transmission and receipt of wireless signals. Understand while shown with this high level view, many variations and alternatives are possible.

Note that ICs such as described herein may be implemented in a variety of different devices such as an IoT device. This IoT device may be a smart utility meter for use in a smart utility network, e.g., a network of stars or gateways in which long-range communication is according to an IEEE 802.15.4 specification or other such wireless protocol.

Figure 6:
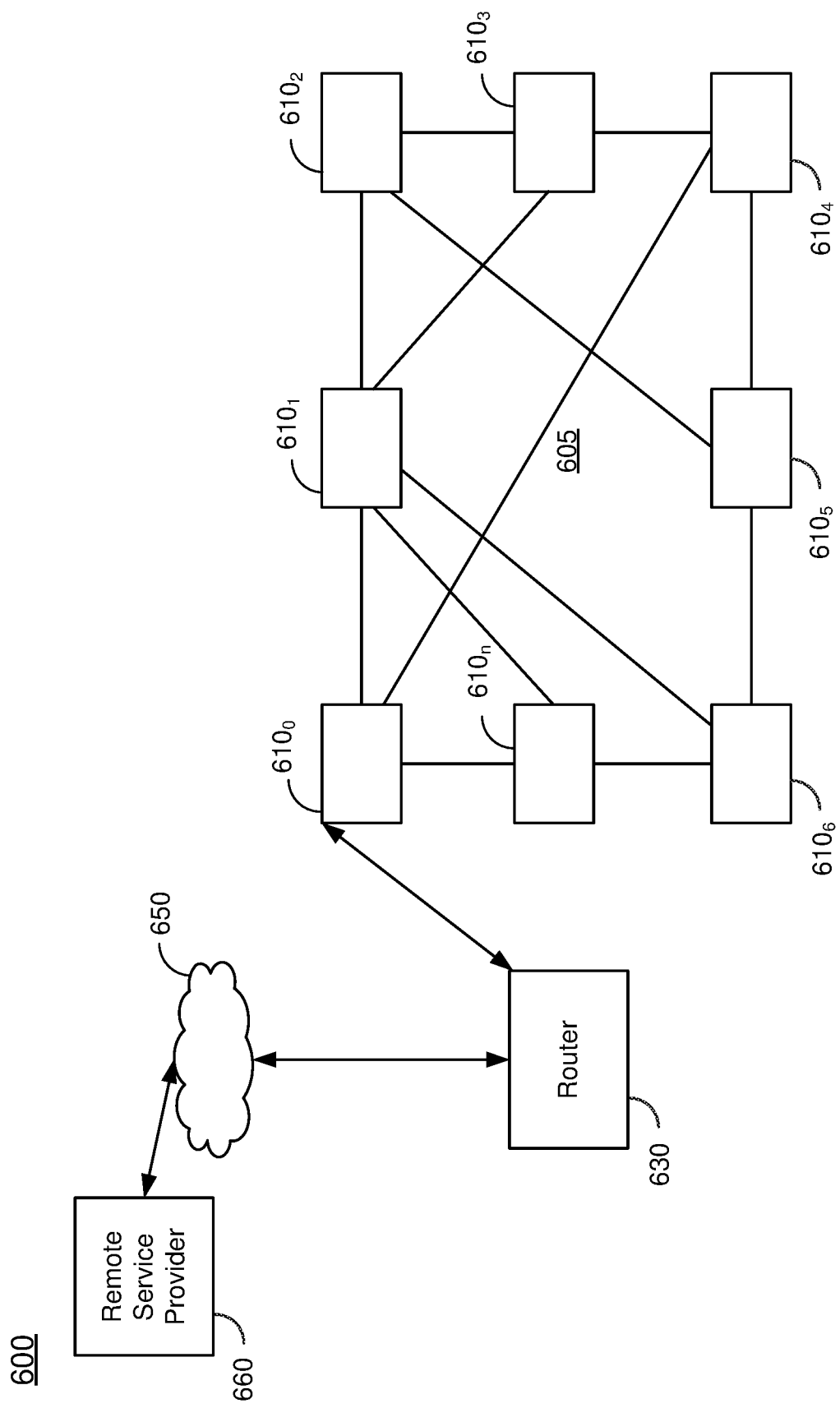
FIG. 6 is a high level diagram of a network in accordance with an embodiment.

Referring now to FIG. 6, shown is a high level diagram of a network in accordance with an embodiment. As shown in FIG. 6, a network 600 includes a variety of devices, including smart devices such as IoT devices, gateways/routers and remote service providers. Such IoT devices may include one or more oscillators having temperature compensation realized in accordance with an embodiment. As shown, at least one IoT device 610 couples to one or more gateway(s) 630 that in turn communicates with a remote service provider 660 via a wide area network 650, e.g., the internet. In an embodiment, remote service provider 660 may be a backend server of a utility that handles communication with IoT devices 610. Understand while shown at this high level in the embodiment of FIG. 6, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   an oscillator to generate a clock signal, the oscillator comprising:
      at least one resistor;
      at least one capacitor; and
      a circuit coupled to the at least one resistor and the at least one capacitor, the circuit to generate the clock signal;
   a voltage regulator coupled to the oscillator to provide a regulated voltage to the oscillator; and
   a bulk voltage generator coupled to the voltage regulator, wherein the bulk voltage generator is to provide a first bulk voltage and a second bulk voltage to the voltage regulator to provide temperature compensation to the oscillator.

2. The apparatus of claim 1, wherein the voltage regulator comprises:
   a current mirror having at least one first node coupled to a supply voltage and an output to output a proportional-to-absolute current (PTAT) current;
   a pass device coupled to the current mirror to receive the PTAT current and output the regulated voltage; and
   a diode circuit comprising a first diode-connected transistor and a second diode-connected transistor, wherein the first diode-connected transistor is to receive the first bulk voltage and the second diode-connected transistor is to receive the second bulk voltage.

3. The apparatus of claim 2, wherein the first diode-connected transistor comprises:
   a first terminal coupled to the pass device;
   a second terminal coupled to a third terminal of the first diode-connected transistor; and
   a fourth terminal to receive the first bulk voltage.

4. The apparatus of claim 2, further comprising:
   a first transistor coupled to the current mirror and the diode circuit, the first transistor to receive the second bulk voltage; and
   a second transistor coupled to the current mirror and the diode circuit, the second transistor to receive the second bulk voltage.

5. The apparatus of claim 1, wherein the oscillator is to output the clock signal that is temperature compensated based at least in part on the first bulk voltage and the second bulk voltage.

6. The apparatus of claim 1, wherein the oscillator comprises:
   the circuit comprising at least one inverter;
   the at least one resistor comprising a programmable resistor coupled to the at least one inverter; and
   the at least one capacitor comprising a programmable capacitor coupled to the at least one inverter.

7. The apparatus of claim 1, wherein the first bulk voltage is a first portion of the regulated voltage and the second bulk voltage is a second portion of the regulated voltage.

8. The apparatus of claim 1, wherein:
first bulk voltage is a first fixed percentage of the regulated voltage; and the
second bulk voltage is a second fixed percentage of the regulated voltage.

9. The apparatus of claim 8, wherein a sum of the first fixed percentage and the second fixed percentage equals the regulated voltage.

10. The apparatus of claim 1, further wherein the bulk voltage regulator comprises at least one digital-to-analog converter (DAC) to receive a digital value and output the first bulk voltage and the second bulk voltage based thereon.

11. The apparatus of claim 10, wherein the at least one DAC comprises:
a first DAC to output the first bulk voltage; and
a second DAC to output the second bulk voltage.

12. The apparatus of claim 10, further comprising a non-volatile storage to store the digital value, the digital value based on manufacturing testing.

13. A method comprising:
receiving, in an integrated circuit, at least one digital value from a non-volatile storage;
generating, in the integrated circuit, a first bulk voltage and a second bulk voltage using the at least one digital value;
providing the first bulk voltage to at least one first transistor of a voltage regulator of the integrated circuit;
providing the second bulk voltage to at least one second transistor of the voltage regulator; and
outputting a regulated voltage from the voltage regulator to an RC oscillator of the integrated circuit, to provide temperature compensation to the RC oscillator.

14. The method of claim 13, further comprising powering at least one inverter of the RC oscillator using the regulated voltage.

15. The method of claim 13, further comprising generating the first bulk voltage and the second bulk voltage in a digital-to-analog converter of the integrated circuit.

16. The method of claim 13, further comprising providing the second bulk voltage to at least two transistors of a constant transconductance circuit of the voltage regulator.

17. The method of claim 13, further comprising determining the first bulk voltage and the second bulk voltage based at least in part on manufacturing testing.

18. An apparatus comprising:
an RC oscillator comprising:
a first circuit to receive a first signal and generate a clock signal based at least in part on the first signal, the first circuit to receive a regulated voltage from a voltage regulator;
at least one resistor coupled to the first circuit, the at least one resistor having temperature variation; and
at least one capacitor coupled to the first circuit;
the voltage regulator coupled to the RC oscillator, the voltage regulator comprising:
a transconductance circuit to receive a supply voltage and output a proportional-to-absolute temperature (PTAT) current;
a pass device coupled to the transconductance circuit to receive the PTAT current and output the regulated voltage based on the PTAT current; and
a second circuit coupled to the pass device, the second circuit comprising a first transistor and a second transistor, wherein the first transistor comprises first, second, third and fourth terminals, the second and third terminals coupled together and the fourth terminal to receive a first voltage, and the second transistor comprising first, second, third and fourth terminals, the second and third terminals coupled together and the fourth terminal to receive a second voltage, the first voltage and the second voltage to compensate for a temperature coefficient of the at least one resistor;
a non-volatile storage to store at least one digital value to identify the first voltage and the second voltage; and
a voltage generator to generate the first voltage and the second voltage based at least in part on the at least one digital value.

19. The apparatus of claim 18, wherein the voltage generator comprises a digital-to-analog converter (DAC) to generate:
the first voltage comprising a first bulk voltage that is a first function of temperature; and
the second voltage comprising a second bulk voltage that is a second function of temperature.

20. The apparatus of claim 19, wherein the DAC is to generate the first bulk voltage that is a first percentage of the regulated voltage the second bulk voltage that is a second percentage of the regulated voltage.

* * * * *